(12) United States Patent
Ohta et al.

(10) Patent No.: US 11,573,122 B2
(45) Date of Patent: Feb. 7, 2023

(54) RESISTIVE ELEMENT ARRAY CIRCUIT, RESISTIVE ELEMENT ARRAY CIRCUIT UNIT, AND INFRARED SENSOR

(71) Applicant: TDK CORPORATION, Tokyo (JP)

(72) Inventors: Naoki Ohta, Tokyo (JP); Yuji Kakinuma, Tokyo (JP); Shinji Hara, Tokyo (JP); Susumu Aoki, Tokyo (JP); Keita Kawamori, Tokyo (JP); Eiji Komura, Tokyo (JP)

(73) Assignee: TDK CORPORATION, Tokyo (JP)

( * ) Notice: Subject to any disclaimer, the term of this patent is extended or adjusted under 35 U.S.C. 154(b) by 785 days.

(21) Appl. No.: 16/550,371

(22) Filed: Aug. 26, 2019

(65) Prior Publication Data

US 2020/0072664 A1   Mar. 5, 2020

(30) Foreign Application Priority Data

Aug. 31, 2018   (JP) .............................. JP2018-163500

(51) Int. Cl.
*G11C 11/00*   (2006.01)
*G01J 1/44*   (2006.01)
(Continued)

(52) U.S. Cl.
CPC .............. *G01J 1/44* (2013.01); *G11C 13/004* (2013.01); *G11C 13/0007* (2013.01); *G11C 13/0028* (2013.01); *G11C 13/0038* (2013.01); *H01L 27/2463* (2013.01); *H01L 37/02* (2013.01); *H01L 45/128* (2013.01); *H01L 45/146* (2013.01); *H03F 3/45071* (2013.01); *G11C 2013/0045* (2013.01); *G11C 2213/32* (2013.01); *G11C 2213/77* (2013.01)

(58) Field of Classification Search
CPC ............ G11C 13/0028; G11C 13/0038; G11C 13/004; G11C 2013/0045; G11C 2213/77
See application file for complete search history.

(56) References Cited

U.S. PATENT DOCUMENTS

2005/0030814 A1\* 2/2005 Oh ........................... G11C 7/06
                                                                365/222
2013/0208528 A1\* 8/2013 Kwak ....................... G11C 8/10
                                                                365/148

(Continued)

FOREIGN PATENT DOCUMENTS

JP         H-08-094443 A      4/1996

*Primary Examiner* — Pho M Luu
(74) *Attorney, Agent, or Firm* — Oliff PLC

(57) ABSTRACT

A resistive element array circuit includes word lines, bit lines, resistive elements, a selector, a differential amplifier, and a ground terminal. The word lines are coupled to a power supply. The resistive elements are each disposed at an intersection of corresponding one of the word lines and corresponding one of the bit lines. The selector is configured to select one word line and one bit line. The differential amplifier includes a positive input terminal configured to be coupled to the selected one of the bit lines which is selected by the selector, a negative input terminal configured to be coupled to non-selected one of the bit lines which is not selected by the selector and to non-selected one of the word lines which is not selected by the selector, an output terminal being coupled to the negative input terminal. The ground terminal is coupled to the positive input terminal.

8 Claims, 3 Drawing Sheets

(51) Int. Cl.
    *H01L 27/24*     (2006.01)
    *H03F 3/45*     (2006.01)
    *G11C 13/00*     (2006.01)
    *H01L 37/02*     (2006.01)
    *H01L 45/00*     (2006.01)

(56) References Cited

U.S. PATENT DOCUMENTS

| | | | |
|---|---|---|---|
| 2014/0104933 A1* | 4/2014 | Yamahira | H01L 27/101 365/148 |
| 2015/0092470 A1* | 4/2015 | Vimercati | G11C 7/14 365/163 |

* cited by examiner

RESISTIVE ELEMENT ARRAY CIRCUIT, RESISTIVE ELEMENT ARRAY CIRCUIT UNIT, AND INFRARED SENSOR

CROSS REFERENCE TO RELATED APPLICATIONS

This application claims the benefit of Japanese Priority Patent Application No. 2018-163500 filed on Aug. 31, 2018, the entire contents of which are incorporated herein by reference.

BACKGROUND

The disclosure relates to a resistive element array circuit having a resistive element array in which a plurality of resistive elements is arranged, a resistive element array circuit unit including the resistive element array circuit, and an infrared sensor including the resistive element array circuit.

A resistive element array circuit having a plurality of resistive elements arranged in a matrix has been proposed. Such a resistive element array circuit is used as, for example, an infrared detection circuit. For example, reference is made to Japanese Unexamined Patent Application Publication No. H08-94443. Such an infrared detection circuit has a plurality of infrared-sensitive resistors arranged therein. Non-limiting examples of the infrared-sensitive resistor include a thermistor that changes its resistance value depending on a temperature.

SUMMARY

A resistive element array circuit according to one example embodiment of the disclosure includes: a plurality of word lines extending in a first direction and arranged side by side in a second direction, and coupled to a power supply; a plurality of bit lines extending in the second direction and arranged side by side in the first direction; a plurality of resistive elements each disposed at an intersection of corresponding one of the word lines and corresponding one of the bit lines, and each coupled to the corresponding one of the word lines and the corresponding one of the bit lines; a selector configured to select one of the word lines and one of the bit lines; a differential amplifier that includes a positive input terminal, a negative input terminal, and an output terminal, the positive input terminal being configured to be coupled to the selected one of the bit lines which is selected by the selector, the negative input terminal being configured to be coupled to non-selected one of the bit lines which is not selected by the selector and to non-selected one of the word lines which is not selected by the selector, the output terminal being coupled to the negative input terminal; and a ground terminal coupled to the positive input terminal.

A resistive element array circuit unit according to one embodiment of the disclosure includes a plurality of resistive element array circuits, the plurality of resistive element array circuits each including a plurality of word lines extending in a first direction and arranged side by side in a second direction, and coupled to a power supply, a plurality of bit lines extending in the second direction and arranged side by side in the first direction, a plurality of resistive elements each disposed at an intersection of corresponding one of the word lines and corresponding one of the bit lines, and each coupled to the corresponding one of the word lines and the corresponding one of the bit lines, a selector configured to select one of the word lines and one of the bit lines, a differential amplifier that includes a positive input terminal, a negative input terminal, and an output terminal, the positive input terminal being configured to be coupled to the selected one of the bit lines which is selected by the selector, the negative input terminal being configured to be coupled to non-selected one of the bit lines which is not selected by the selector and to non-selected one of the word lines which is not selected by the selector, the output terminal being coupled to the negative input terminal, and a ground terminal coupled to the positive input terminal; and a controller configured to perform, concurrently on the resistive element array circuits, a read control involving controlling the power supply to cause an electric current to be supplied sequentially, via the word lines, to the resistive elements that are arranged in the second direction along the one selected bit line.

An infrared sensor according to one embodiment of the disclosure includes a resistive element array circuit, the resistive element array circuit including: a plurality of word lines extending in a first direction and arranged side by side in a second direction, and coupled to a power supply; a plurality of bit lines extending in the second direction and arranged side by side in the first direction; a plurality of resistive elements each disposed at an intersection of corresponding one of the word lines and corresponding one of the bit lines, and each coupled to the corresponding one of the word lines and the corresponding one of the bit lines; a selector configured to select one of the word lines and one of the bit lines; a differential amplifier that includes a positive input terminal, a negative input terminal, and an output terminal, the positive input terminal being configured to be coupled to the selected one of the bit lines which is selected by the selector, the negative input terminal being configured to be coupled to non-selected one of the bit lines which is not selected by the selector and to non-selected one of the word lines which is not selected by the selector, the output terminal being coupled to the negative input terminal; and a ground terminal coupled to the positive input terminal.

BRIEF DESCRIPTION OF THE DRAWINGS

The accompanying drawings are included to provide a further understanding of the disclosure, and are incorporated in and constitute a part of this specification. The drawings illustrate embodiments and, together with the specification, serve to explain the principles of the disclosure.

DETAILED DESCRIPTION

Figure 1:
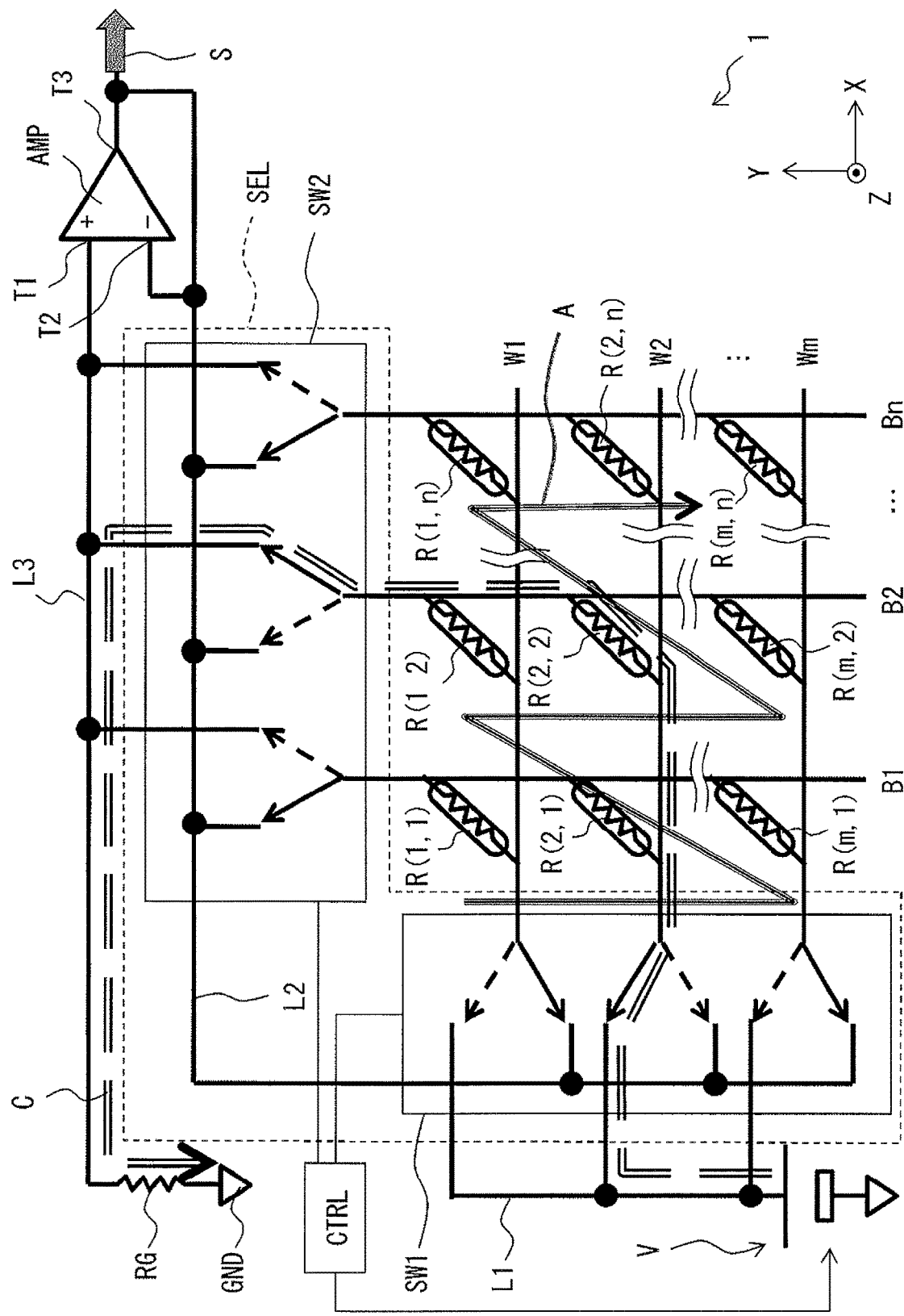
FIG. 1 is a circuit diagram illustrating a schematic configuration example of a resistive element array circuit according to one example embodiment.

Some embodiments of the disclosure are described below in detail with reference to the accompanying drawings.

It is to be noted that the following description is directed to illustrative examples of the technology and not to be construed as limiting to the technology. Factors including, without limitation, numerical values, shapes, materials, components, positions of the components, and how the components are coupled to each other are illustrative only and not to be construed as limiting to the technology.

Further, elements in the following example embodiments which are not recited in a most-generic independent claim of the technology are optional and may be provided on an as-needed basis. The drawings are schematic and are not intended to be drawn to scale. It is to be noted that the like elements are denoted with the same reference numerals, and any redundant description thereof will not be described in detail. It is to be noted that the description is given in the following order.

1. First Example Embodiment (Example of a resistive element array circuit having a resistive element array)
2. Second Example Embodiment (Example of a resistive element array circuit unit including a plurality of resistive element array circuits)
3. Modification Example It is desirable that an infrared detection circuit have higher operational reliability.

It is desirable to provide a resistive element array circuit, a resistive element array circuit unit, and an infrared sensor that are able to achieve higher operational reliability.

1. First Example Embodiment

[Overall Configuration Example of Resistive Element Array Circuit 1]

FIG. 1 is a circuit diagram schematically illustrating an overall configuration example of a resistive element array circuit 1 according to a first example embodiment of the disclosure. The resistive element array circuit 1 may be mounted to an infrared thermography, for example, and may be configured to convert infrared rays with which the resistive element array circuit 1 is irradiated into an electrical signal corresponding to an intensity of the infrared rays, and to output the electrical signal as an output signal S.

As illustrated in FIG. 1, the resistive element array circuit 1 includes, for example, a plurality of word lines W (W1 to Wm), a plurality of bit lines B (B1 to Bn), a plurality of resistive elements R (R(1,1) to R(m,n)), a selector SEL, a differential amplifier AMP, and a ground terminal GND. The resistive element array circuit 1 may also include a resistor RG, a controller CTRL, and wiring lines L1 to L3. It is to be noted that, herein, a resistive element R positioned at the intersection of an a-th word line Wa out of the word lines W1 to Wm and a b-th bit line Bb out of the bit lines B1 to Bn is denoted as R(a,b).

[Word Line W]

The word lines W extend in an X-axis direction and are arranged side by side in a Y-axis direction. It is to be noted that, although an example in which m-number of word lines W are provided is illustrated in FIG. 1, it is possible to set the number of word lines W to any number. One end of each of the word lines W may be couplable to a power supply V via a selection switch SW1 (to be described later) in a selector SEL. Upon a resistance value of any one resistive element R out of the resistive elements R is to be read, a predetermined sense current may be supplied from the power supply V to a word line W corresponding to the one resistive element R. In one embodiment of the disclosure, the X-axis direction corresponds to a specific but non-limiting example of a "first direction". In one embodiment of the disclosure, the Y-axis direction corresponds to a specific but non-limiting example of a "second direction".

[Bit Line B]

The bit lines B may each intersect the word lines W. In one example, the bit lines B extend in the Y-axis direction and are arranged side by side in the X-axis direction. However, the bit lines B may not necessarily be in direct contact with the word lines W, and may be separated away from the word lines W in the Z-axis direction. It is to be noted that, although an example in which n-number of bit lines B are provided is illustrated in FIG. 1, it is possible to set the number of bit lines B to any number. In one example embodiment, however, the number of word lines W may be larger than the number of bit lines B. One reason is that it is advantageous in suppressing a temperature rise of each resistive element R upon reading a resistance value of each resistive element R.

[Resistive Element R]

The resistive elements R are each disposed at the intersection of corresponding one of the word lines W and corresponding one of the bit lines B. The resistive elements R may each have a first end coupled to the corresponding one of the word lines W and a second end coupled to the corresponding one of the bit lines B. In one example, the resistive elements R(1,1) to R(1,n) may each be disposed at corresponding one of the intersections of the word line W1 and the bit lines B1 to Bn, the resistive element R(2,1) to R(2,n) may each be disposed at corresponding one of the intersections of the word line W2 and the bit lines B1 to Bn, and the resistive element R(m,1) to R(m,n) may each be disposed at corresponding one of the intersections of the word line Wm and the bit lines B1 to Bn.

The resistive element R may be an infrared ray receiving element that converts infrared rays collected by a lens, for example, into an electrical signal. In one example, the resistive element R may be a microbolometer including: a resistance change layer that exhibits a resistance change depending on a temperature; and an infrared absorption layer that is provided adjacent to the resistance change layer and absorbs infrared rays and generates heat. The resistance change layer may include vanadium oxide, for example. The infrared absorption layer may include silicon oxide ($SiO_2$), for example. In the resistive element R, a temperature in the infrared absorption layer changes depending on an intensity of received infrared rays, and as a result, a resistance value of the resistance change layer placed adjacent to the infrared absorption layer changes.

[Selector SEL]

The selector SEL may include a selection switch SW1 and a selection switch SW2. The selection switch SW1 selects one word line Ws out of the word lines W, and may cause the selected word line Ws to be coupled to the wiring line L1. It is to be noted that FIG. 1 illustrates an example in which the selection switch SW1 selects the word line W2 as the selected word line Ws, and couples the word line W2 to the wiring line L1. Alternatively, the selection switch SW2 selects one bit line Bs out of the bit lines B. FIG. 1 illustrates an example in which the selection switch SW2 selects the bit line B2 as the selected bit line Bs, and couples the bit line B2 to the wiring line L3. Operations of the selection switch SW1 and the selection switch SW2 included in the selector SEL may be executed on the basis of a command transmitted from the controller CTRL.

[Differential Amplifier AMP]

The differential amplifier AMP includes a positive input terminal T1, a negative input terminal T2, and an output terminal T3. The positive input terminal T1 is configured to be coupled to the selected one of the bit lines B which is selected by the selection switch SW2. The negative input terminal T2 is configured to be coupled to non-selected one of the bit lines B which is not selected by the selection switch SW2 and to non-selected one of the word lines W which is not selected by the selection switch SW1. The negative input terminal T2 may be coupled to the non-selected bit line B and to the non-selected word line W via the wiring line L2. The output terminal T3 is coupled to the negative input terminal T2. The output terminal T3 may be coupled to the negative input terminal T2 through the wiring line L2.

[Ground Terminal GND and Resistor RG]

The ground terminal GND is coupled to the positive input terminal T1. The ground terminal GND may be coupled to the positive input terminal T1 via the wiring line L3. The resistor RG may be provided on the wiring line L3 between the ground terminal GND and the positive input terminal T1. The resistor RG may be a variable resistor or may be a fixed resistor.

[Controller CTRL]

The controller CTRL may control the power supply V to cause a sense current C to be supplied sequentially to the resistive elements R arranged in the Y-axis direction along the bit line B, via the word lines W corresponding to the respective resistive elements R. It is to be noted that the power supply V may be provided inside the resistive element array circuit 1, or may be provided outside the resistive element array circuit 1.

[Read Operation of Resistive Element Array Circuit 1]

The resistive element array circuit 1 is able to read a resistance value in each resistive element R in the following manner, for example.

In an example case, when assuming that (m×n)-number of resistive elements R are arranged in a matrix, that is, m-number of resistive elements R are arranged in the Y-axis direction and n-number of resistive elements R are arranged in the X-axis direction in the resistive element array circuit 1, the controller CTRL may supply sequentially the sense current C to all of the (m×n)-number of resistive elements R in order indicated by an arrow A illustrated in FIG. 1, and may cause the output signal S to be outputted from the output terminal T3 of the differential amplifier AMP.

In one example, the controller CTRL may supply sequentially the sense current C to the resistive elements R, starting from the resistive element R(1,1) as the first resistive element R, for example, then from the resistive element R(2,1) to the resistive element R(m,1), those of which are arranged in the Y-axis direction, in such a manner to count sequentially the resistive elements R. That is, the controller CTRL may perform a control that, first, causes the selection switch SW2 to select the bit line B1, and that causes, for the resistive elements R(1,1), R(2,1), R(3,1), . . . , and R(m,1), those of which are arranged along the bit line B1, the selection switch SW1 to select sequentially the word lines W1 to Wm, to thereby cause the power supply V to apply sequentially the sense current C to the word lines W1 to Wm.

Thereafter, the controller CTRL may supply sequentially the sense current C to the resistive elements R, from the resistive element R(1,2) to the resistive element R(m,2), those of which are arranged in the Y-axis direction, in such a manner to count sequentially the resistive elements R. That is, the controller CTRL may perform a control that causes the selection switch SW2 to select the bit line B2, and that causes, for the resistive elements R(1,2), R(2,2), R(3,2), . . . , and R(m,2), those of which are arranged along the bit line B2, the selection switch SW1 to select sequentially the word lines W1 to Wm, to thereby cause the power supply V to apply sequentially the sense current C to the word lines W1 to Wm.

Thereafter, the controller CTRL may supply sequentially the sense current C to the resistive elements R, from the resistive element R(1,n) to the resistive element R(m,n), those of which are arranged in the Y-axis direction, in such a manner to count sequentially the resistive elements R. That is, the controller CTRL may perform a control that causes the selection switch SW2 to select the bit line Bn, and that causes, for the resistive elements R(1,n), R(2,n), R(3,n), . . . , and R(m,n), those of which are arranged along the bit line Bn, the selection switch SW1 to select sequentially the word lines W1 to Wm, to thereby cause the power supply V to apply sequentially the sense current C to the word lines W1 to Wm.

In this manner, the resistive element array circuit 1 is able to read a resistance value of each resistive element R as an output signal S from the output terminal T3 of the differential amplifier AMP.

It is to be noted that FIG. 1 illustrates a path of the sense current C where the resistive element R(2,2) is selected. Here, in the resistive element array circuit 1, the word line W2 may be selected by the selection switch SW1 and the bit line B2 may be selected by the selection switch SW2. In this case, the sense current C may be supplied from the power supply V via the wiring line L1 to the word line W2, following which the sense current C may flow through the resistive element R(2,2) and into the wiring line L3. Thereafter, the sense current C may flow through the resistor RG and out to the ground terminal GND. A magnitude of the sense current C may be limited depending on a resistance value of the resistor RG, and it is therefore possible to reduce electric power consumption at the time of performing the read operation in the resistive element array circuit 1, depending on the resistance value of the resistor RG.

[Workings and Example Effects of Resistive Element Array Circuit 1]

As described above, the resistive element array circuit 1 according to the first example embodiment has the differential amplifier AMP that includes: the positive input terminal T1 configured to be coupled to one of the bit lines B which is selected by the selector SEL; the negative input terminal T2 configured to be coupled to a non-selected bit line and a non-selected word line; and the output terminal T3 coupled to the negative input terminal T2. Accordingly, the positive input terminal T1, the negative input terminal T2 and the output terminal T3 included in the differential amplifier AMP each have substantially the same electric potential. Therefore, the output signal S is substantially uninfluenced by the electric potential of the non-selected bit line and the electric potential of the non-selected word line, and has more accurate value.

In addition, the resistive element array circuit 1 according to the first example embodiment may further include the resistor RG provided between the positive input terminal T1 of the differential amplifier AMP and the ground terminal GND. Accordingly, it is possible to limit the sense current C to be flown into the ground terminal GND by setting the resistance value of the resistor RG to an appropriate value. As a result, it is possible to reduce electric power consumption in the entire read operation performed in the resistive element array circuit 1.

In contrast, for example, the infrared detection circuit disclosed in Japanese Unexamined Patent Application Publication (JP-A) No. H08-94443 couples an output from a selected cell to a negative input terminal of an inverting amplifier OP, and couples a positive input terminal of the inverting amplifier OP to a ground. Moreover, the infrared detection circuit of JP-A No. H08-94443 couples both a non-selected row and a non-selected column to the ground, and causes an electric potential of the non-selected row and an electric potential of the non-selected column to be the same as electric potential of the inverting amplifier OP. The infrared detection circuit of JP-A No. H08-94443 avoids a sneak current from the non-selected row by the above-mentioned configuration. However, in the infrared detection circuit of JP-A No. H08-94443, a sense current flown into the non-selected row is flown into the ground consequently, which can make the electric power consumption in the entire infrared detection circuit remarkably large.

In that respect, the resistive element array circuit 1 according to the first example embodiment causes the positive input terminal T1, the negative input terminal T2, and the output terminal T3 included in the differential amplifier AMP to have substantially the same electric potential with each other, and also includes the resistor RG. It is therefore possible to enhance a stability of the output signal S and to limit the sense current C to be flown into the ground terminal GND, thereby making it possible to reduce electric power consumption in the entire read operation performed in the resistive element array circuit 1. That is, the resistive element array circuit 1 according to the first example embodiment is expected to have higher operational reliability with low electric power consumption.

Figure 2:
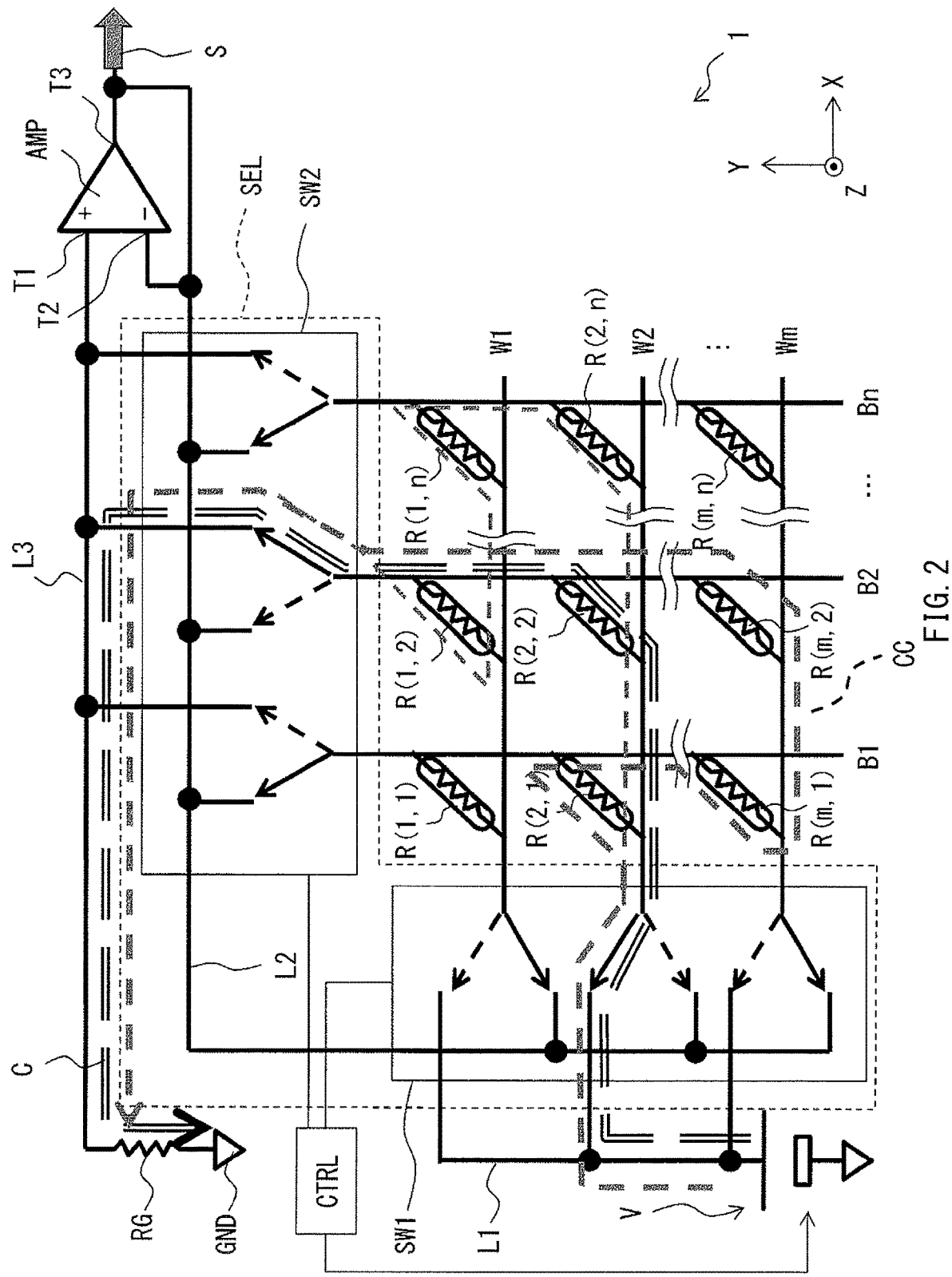
FIG. 2 is an explanatory diagram describing a path of a sneak current in the resistive element array circuit illustrated in FIG. 1.

Incidentally, in such a resistive element array circuit 1, the sense current C is supplied to the resistive element R as described above upon the resistance value of the resistive element R is to be read. The resistive element R can, however, generate heat by the supply of the sense current C. In some cases, this can influence the resistance value, which is supposed to change depending on a radiant heat to be detected. In the resistive element array circuit 1 according to the first example embodiment, there can be a case where the sense current C, although an amount of which is small, leaks to a non-selected resistive element R other than the selected resistive element R. For example, as illustrated in the explanatory diagram of FIG. 2, in a case where the word line W2 is selected by the selection switch SW1 and the bit line B2 is selected by the selection switch SW2, a sneak current CC can occur in a path indicated by an arrow CC, for example. In this case, because the non-selected resistive element R that the sneak current CC passes generates heat, the resistance value of the non-selected resistive element R can increase. As a result, the output signal S may be influenced, which has information regarding the intensity of received infrared rays.

Accordingly, in the resistive element array circuit 1, the controller CTRL may control the power supply V to cause the sense current C to be supplied sequentially, via the word lines W, to the resistive elements R arranged in the Y-axis direction along the bit line B. In this way, it is possible to suppress the influence on the output signal S due to the heat generation attributed to the sneak current. One reason is that, as compared with a case where the respective resistance values of the resistive elements R arranged in the X-axis direction along one word line W are sequentially read, for example, a time period in which the sense current C continuously flows (continuous electric power supply time period) with respect to a single word line W is shortened. In other words, with an increase in the continuous electric power supply time period with respect to a single word line W, an amount of heat generation in the resistive elements R arranged along the word line W also increases. However, because the controller CTRL is able to shorten the continuous electric power supply time period by controlling the power supply V as described above, it is possible to reduce the amount of heat generation in the resistive element R.

Moreover, the resistive element array circuit 1 is able to suppress the influence on the output signal S due to the heat generation of the resistive elements R in a case where the number "m" of word lines W is made larger than the number "n" of bit lines B (m>n). Some reasons are as follows. One reason is that, in a case where the same number of resistive elements R as the number of resistive elements R where m>n are arranged, it is possible to reduce the number of resistive elements R arranged in each word line W as compared with a case where the number "n" of bit lines B is larger than the number "m" of word lines W (m<n). Therefore, it is possible to suppress a total amount of heat generation of all the resistive elements R arranged along a word line W when the sense current C is supplied to the relevant word line W. Another reason is that, in the case where the same number of resistive elements R as the number of resistive elements R where m>n are arranged, it is possible to increase a time interval from the end of supplying sequentially electric power to the word lines W to the start of supplying sequentially electric power to the same word lines W again, as compared with the case where the number "n" of bit lines B is made larger than the number "m" of word lines W (m<n). Therefore, it is possible to secure a longer time period for cooling the resistive elements R arranged along each word line W, and to suppress temperature rise in the resistive elements R arranged along each word line W.

2. Second Example Embodiment

[Overall Configuration Example of Resistive Element Array Circuit Unit 2]

Figure 3:
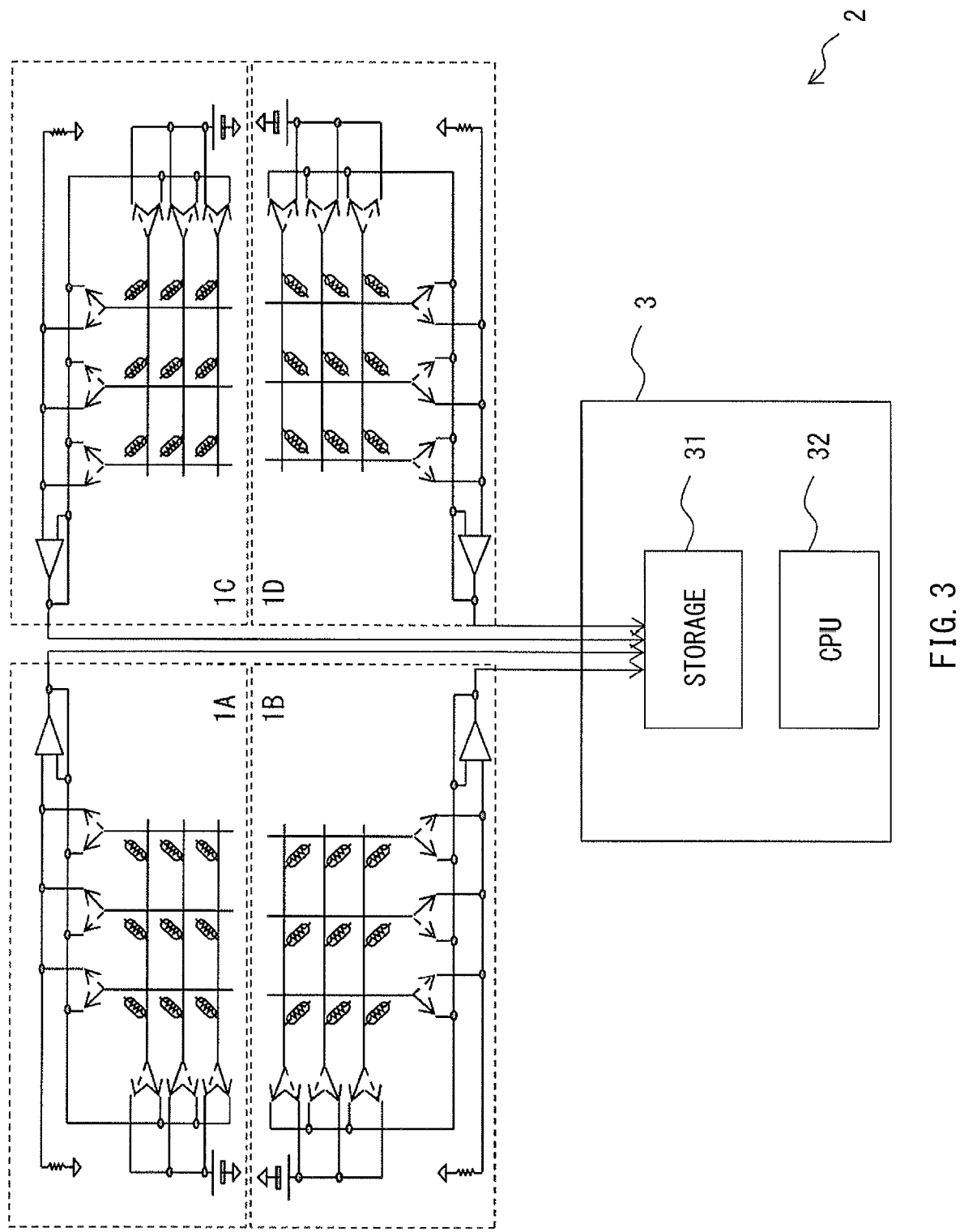
FIG. 3 is a schematic diagram illustrating a schematic configuration example of a resistive element array circuit unit according to one example embodiment.

FIG. 3 is a schematic diagram illustrating an overall configuration example of a resistive element array circuit unit 2 according to a second example embodiment of the disclosure. The resistive element array circuit unit 2 includes a plurality of resistive element array circuits 1 (1A to 1D). It is to be noted that, although FIG. 3 illustrates an example in which four resistive element array circuits 1A to 1D are included, any embodiment of the disclosure is not limited thereto. Further, the resistive element array circuits 1A to 1D each have substantially the same configuration as the resistive element array circuit 1 described in the first example embodiment. However, in the resistive element array circuit unit 2, no controller CTRL is included in any of the resistive element array circuits 1A to 1D, and a controller 3 is included commonly to all the resistive element array circuits 1A to 1D.

The controller 3 concurrently performs read control on the resistive element array circuits 1A to 1D. The read control may control the power supply V to cause the sense current C to be supplied sequentially, via the word lines W, to the resistive elements R arranged in the Y-axis direction along a bit line B. Moreover, the controller 3 may include a storage 31 and a central processing unit (CPU) 32. In one embodiment of the disclosure, the CPU 32 corresponds to a specific but non-limiting example of a "processor". The storage 31 may store a plurality of pieces of resistance value data respectively read from the resistive element array circuits 1A to 1D by the above-mentioned read control. The CPU 32 may output sequentially the pieces of resistance value data stored in the storage 31.

As described above, in the resistive element array circuit unit 2 according to the second example embodiment, a plurality of (for example, four) regions, i.e., resistive element array circuits, are allocated to a plurality of resistive elements arranged in a matrix, and the read operation on the regions is concurrently performed. Therefore, it is possible to obtain the output signal S in a shorter time.

3. Modification Example

Some example embodiments of the disclosure have been described hereinabove. However, the disclosure is not limited to such example embodiments, and may be modified in a variety of ways.

The description has been given of the foregoing example embodiments of the disclosure, for example, by referring to specific configuration examples (such as arrangement and number) of the respective components of the resistive element array circuit 1. However, the configuration examples of the respective components are not limited to those described in the foregoing example embodiments; any other arrangement and any other number, for example, may be adopted.

Moreover, according to the foregoing example embodiments of the disclosure, description has been made on the case where the resistive element array circuit is mounted to an infrared thermography, and the infrared rays with which the resistive element array circuit is irradiated are converted into the electrical signal corresponding to the intensity of the infrared rays, and the electrical signal is outputted as the output signal S. However, the disclosure is not limited thereto. For example, the resistive element is not limited to a microbolometer, and may be a magnetic tunnel junction element. In that case, it is possible to use the resistive element array circuit as a magnetoresistive random access memory (MRAM) circuit.

Further, in the resistive element array circuit unit 2 described in the second example embodiment, the resistive element array circuits 1 (1A to 1D) may be provided on the same substrate, or may be provided on two or more substrates.

In addition, a series of processes described in the foregoing example embodiments of the disclosure may be executed by any of hardware (circuit), or software (program). In a case where the series of processes is executed by software, the software is configured by a group of programs that causes a computer to execute various functions. Each program may be used by being recorded on the computer in advance, or by being installed on the computer from a network or a recording medium.

It is to be noted that the effects described herein are merely exemplary and not limitative, and may include other effects.

In one embodiment, the resistive element array circuit and the resistive element array circuit unit may each be used for an infrared thermography or an infrared sensor, for example. In another embodiment, the resistive element array circuit and the resistive element array circuit unit can be used as a storage processing circuit using, as the resistive element, a magnetoresistive element or a resistance change element that changes its resistance depending on an electric voltage.

Moreover, the disclosure encompasses any possible combination of some or all of the various embodiments and the modification examples described herein and incorporated herein.

It is possible to achieve at least the following configurations from the above-described example embodiments of the disclosure.

(1)
A resistive element array circuit including:
a plurality of word lines extending in a first direction and arranged side by side in a second direction, and coupled to a power supply;
a plurality of bit lines extending in the second direction and arranged side by side in the first direction;
a plurality of resistive elements each disposed at an intersection of corresponding one of the word lines and corresponding one of the bit lines, and each coupled to the corresponding one of the word lines and the corresponding one of the bit lines;
a selector configured to select one of the word lines and one of the bit lines;
a differential amplifier that includes a positive input terminal, a negative input terminal, and an output terminal, the positive input terminal being configured to be coupled to the selected one of the bit lines which is selected by the selector, the negative input terminal being configured to be coupled to non-selected one of the bit lines which is not selected by the selector and to non-selected one of the word lines which is not selected by the selector, the output terminal being coupled to the negative input terminal; and
a ground terminal coupled to the positive input terminal.

(2)
The resistive element array circuit according to (1), further including a resistor provided between the positive input terminal and the ground terminal.

(3)
The resistive element array circuit according to (1) or (2), further including a controller configured to control the power supply to cause an electric current to be supplied sequentially, via the word lines, to the resistive elements that are arranged in the second direction along the one selected bit line.

(4)
The resistive element array circuit according to any one of (1) to (3), in which the number of word lines is larger than the number of bit lines.

(5)
A resistive element array circuit unit including:
a plurality of resistive element array circuits,
the plurality of resistive element array circuits each including
a plurality of word lines extending in a first direction and arranged side by side in a second direction, and coupled to a power supply,
a plurality of bit lines extending in the second direction and arranged side by side in the first direction,
a plurality of resistive elements each disposed at an intersection of corresponding one of the word lines and corresponding one of the bit lines, and each coupled to the corresponding one of the word lines and the corresponding one of the bit lines,
a selector configured to select one of the word lines and one of the bit lines,
a differential amplifier that includes a positive input terminal, a negative input terminal, and an output terminal, the positive input terminal being configured to be coupled to the selected one of the bit lines which is selected by the selector, the negative input terminal being configured to be coupled to non-selected one of the bit lines which is not selected by the selector and to non-selected one of the word lines which is not selected by the selector, the output terminal being coupled to the negative input terminal, and
a ground terminal coupled to the positive input terminal; and
a controller configured to perform, concurrently on the resistive element array circuits, a read control involving controlling the power supply to cause an electric current to be supplied sequentially, via the word lines, to the resistive elements that are arranged in the second direction along the one selected bit line.

(6) The resistive element array circuit unit according to (5), in which the controller includes:
a storage configured to store a plurality of pieces of resistance value data respectively read from the resistive element array circuits by the read control; and
a processor configured to output sequentially the pieces of resistance value data stored in the storage.

(7) An infrared sensor with a resistive element array circuit, the resistive element array circuit including:
a plurality of word lines extending in a first direction and arranged side by side in a second direction, and coupled to a power supply;
a plurality of bit lines extending in the second direction and arranged side by side in the first direction;
a plurality of resistive elements each disposed at an intersection of corresponding one of the word lines and corresponding one of the bit lines, and each coupled to the corresponding one of the word lines and the corresponding one of the bit lines;
a selector configured to select one of the word lines and one of the bit lines;
a differential amplifier that includes a positive input terminal, a negative input terminal, and an output terminal, the positive input terminal being configured to be coupled to the selected one of the bit lines which is selected by the selector, the negative input terminal being configured to be coupled to non-selected one of the bit lines which is not selected by the selector and to non-selected one of the word lines which is not selected by the selector, the output terminal being coupled to the negative input terminal; and
a ground terminal coupled to the positive input terminal.

According to the resistive element array circuit, the resistive element array circuit unit, and the infrared sensor in one embodiment of the disclosure, the positive input terminal, the negative input terminal, and the output terminal included in the differential amplifier each have substantially the same electric potential. Therefore, the resistive element array circuit, the resistive element array circuit unit, and the infrared sensor are not influenced by electric potential in the non-selected bit line and the non-selected word line, and variation in an electric voltage is suppressed.

According to the resistive element array circuit, the resistive element array circuit unit, and the infrared sensor in one embodiment of the disclosure, it is possible to obtain higher operational reliability.

Although the disclosure has been described in terms of exemplary embodiments, it is not limited thereto. It should be appreciated that variations may be made in the described embodiments by persons skilled in the art without departing from the scope of the disclosure as defined by the following claims. The limitations in the claims are to be interpreted broadly based on the language employed in the claims and not limited to examples described in this specification or during the prosecution of the application, and the examples are to be construed as non-exclusive. For example, in this disclosure, the term "preferably", "preferred" or the like is non-exclusive and means "preferably", but not limited to. The use of the terms first, second, etc. do not denote any order or importance, but rather the terms first, second, etc. are used to distinguish one element from another. The term "substantially" and its variations are defined as being largely but not necessarily wholly what is specified as understood by one of ordinary skill in the art. The term "about" as used herein can allow for a degree of variability in a value or range. Moreover, no element or component in this disclosure is intended to be dedicated to the public regardless of whether the element or component is explicitly recited in the following claims.

What is claimed is:

1. A resistive element array circuit comprising:
a plurality of word lines extending in a first direction and arranged side by side in a second direction;
a plurality of bit lines extending in the second direction and arranged side by side in the first direction;
a plurality of resistive elements each disposed at an intersection of corresponding one of the word lines and corresponding one of the bit lines, and each coupled to the corresponding one of the word lines and the corresponding one of the bit lines;
a selector configured to select one of the word lines and one of the bit lines; and
a differential amplifier that includes a positive input terminal, a negative input terminal, and an output terminal, the output terminal being coupled to the negative input terminal,
wherein
the selected one of the word lines which is selected by the selector is configured to be coupled to a power supply, and non-selected at least one of the word lines not selected by the selector is configured not to be coupled to the power supply,
the positive input terminal is configured to be coupled to the selected one of the bit lines which is selected by the selector, and is configured not to be coupled to non-selected at least one of the bit lines not selected by the selector, and
the negative input terminal is configured to be coupled to both the non-selected at least one of the bit lines and the non-selected at least one of the word lines, and is configured not to be coupled to the selected one of the bit lines and the selected one of the word lines.

2. The resistive element array circuit according to claim 1, further comprising:
a ground terminal coupled to the positive input terminal; and
a resistor provided between the positive input terminal and the ground terminal.

3. The resistive element array circuit according to claim 1, further comprising a controller configured to control the power supply to cause an electric current to be supplied sequentially, via the word lines, to the resistive elements that are arranged in the second direction along the one selected bit line.

4. The resistive element array circuit according to claim 1, wherein the number of word lines is larger than the number of bit lines.

5. An infrared sensor, comprising the resistive element array circuit according to claim 1.

6. A resistive element array circuit unit comprising:
a plurality of resistive element array circuits, the plurality of resistive element array circuits each including
a plurality of word lines extending in a first direction and arranged side by side in a second direction,
a plurality of bit lines extending in the second direction and arranged side by side in the first direction,
a plurality of resistive elements each disposed at an intersection of corresponding one of the word lines and corresponding one of the bit lines, and each coupled to the corresponding one of the word lines and the corresponding one of the bit lines, a selector configured to select one of the word lines and one of the bit lines, and a differential amplifier that includes a positive input terminal, a negative input terminal, and an output terminal, the positive input terminal being configured to be coupled to the selected one of the bit lines which is selected by the selector, the negative input terminal being configured to be coupled to non-selected at least one of the bit lines not selected by the selector and to non-selected at least one of the word lines not selected by the selector, the output terminal being coupled to the negative input terminal; and a controller configured to perform, concurrently on the resistive element array circuits, a read control involving controlling a power supply to cause an electric current to be supplied sequentially, via the word lines, to the resistive elements that are arranged in the second direction along the one selected bit line, wherein the selected one of the word lines which is selected by the selector is coupled to the power supply.

7. The resistive element array circuit unit according to claim 6, wherein the controller comprises:

a storage configured to store a plurality of pieces of resistance value data respectively read from the resistive element array circuits by the read control; and a processor configured to output sequentially the pieces of resistance value data stored in the storage.

8. An infrared sensor, comprising the resistive element array circuit unit according to claim 6.

\* \* \* \* \*